United States Patent [19]

Corsaro et al.

[11] 4,101,066
[45] Jul. 18, 1978

[54] SOLDERING METHOD AND APPARATUS UTILIZING DUAL SOLDER WAVES OF DIFFERENT VARIABLE VELOCITIES

[75] Inventors: Vincent A. Corsaro, Haverhill; Ernst A. Gutbier, North Andover, both of Mass.

[73] Assignee: Western Electric Co., Inc., New York, N.Y.

[21] Appl. No.: 829,559

[22] Filed: Aug. 31, 1977

[51] Int. Cl.² .......................... B23K 1/02; H05K 3/34
[52] U.S. Cl. .................................. 228/180 R; 228/37; 228/260
[58] Field of Search ...................... 228/37, 260, 180 R

[56] References Cited

U.S. PATENT DOCUMENTS

| | | |
|---|---|---|
| 3,039,185 | 6/1962 | Oates .................................. 228/37 X |
| 3,119,363 | 1/1964 | Rieben ................................. 228/37 |
| 3,482,755 | 12/1969 | Raciti .................................. 228/37 X |
| 3,565,319 | 2/1971 | Eschenbrucher ...................... 228/37 |
| 3,993,235 | 11/1976 | Boynton ............................... 228/37 |

FOREIGN PATENT DOCUMENTS

| | | | |
|---|---|---|---|
| 1,099,330 | 2/1968 | United Kingdom .................. 228/37 |
| 395,197 | 1/1974 | U.S.S.R. ............................. 228/37 |

Primary Examiner—Donald G. Kelly
Assistant Examiner—K. J. Ramsey
Attorney, Agent, or Firm—D. D. Bosben

[57] ABSTRACT

In the wave soldering of terminals of an electrical device, such as a miniaturized printed circuit board assembly, the board is moved along a predetermined path so that it initially engages a first solder wave flowing counter to the direction of the board movement and subsequently engages a second solder wave flowing in the direction of board movement. The velocity of the solder in each of the solder waves is controlled independently by having separate independent pumping systems. Thus, the solder waves can be set at different independent velocities to achieve proper soldering of the terminals and associated conductor paths while reducing crossovers or bridges (i.e., shorts) between the terminals and the conductor paths as a result of the close spacing thereof.

10 Claims, 5 Drawing Figures

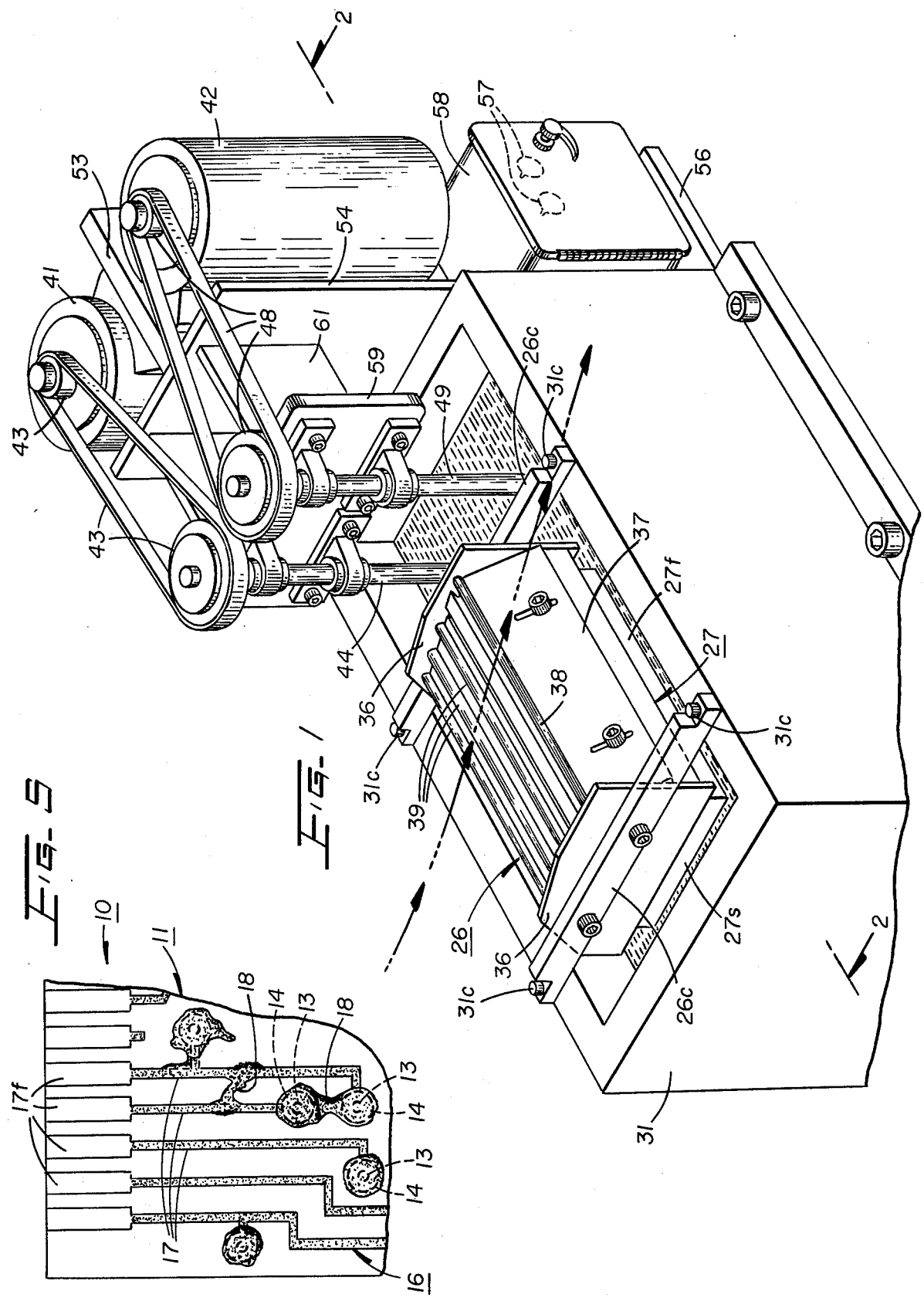

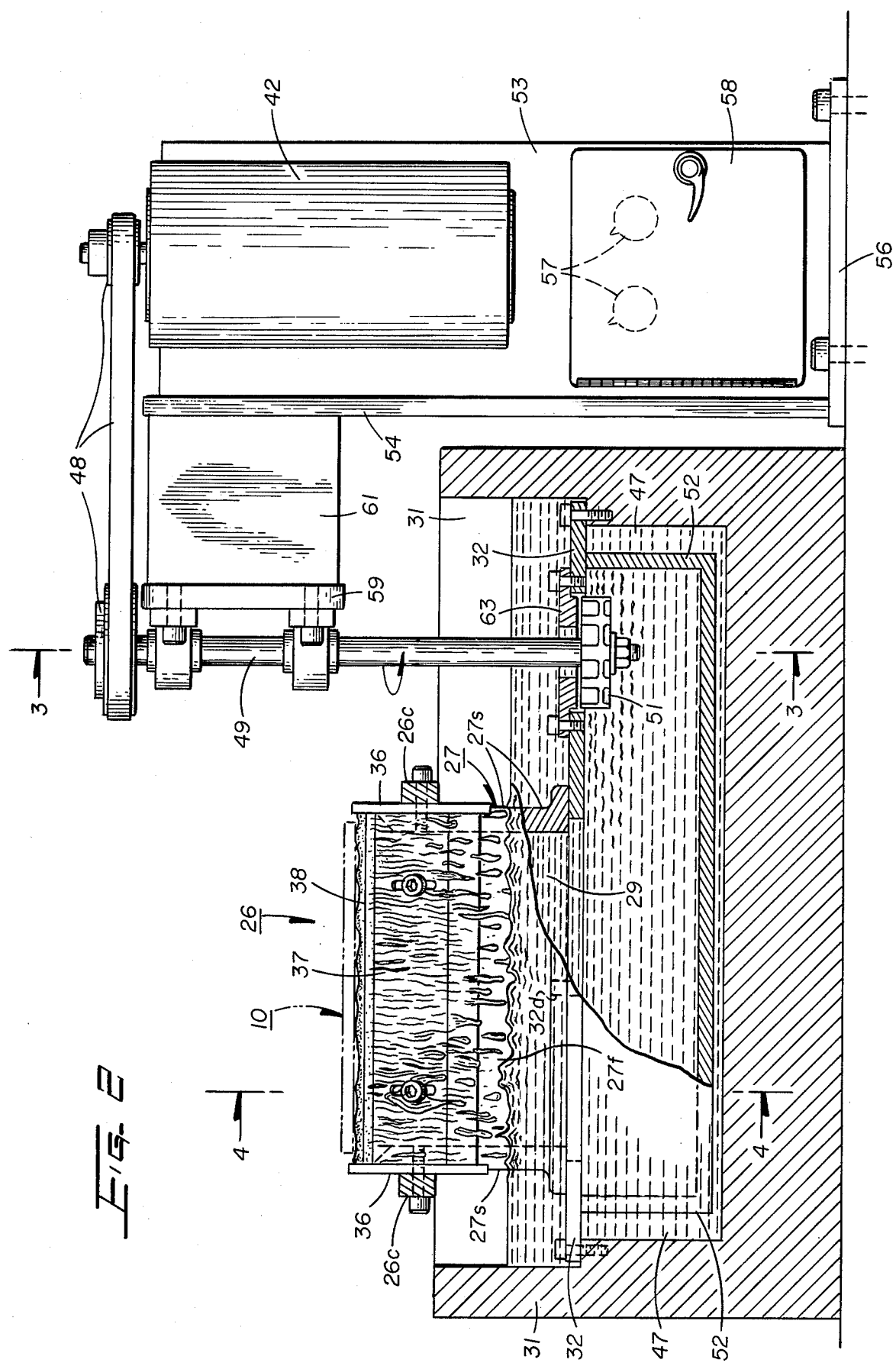

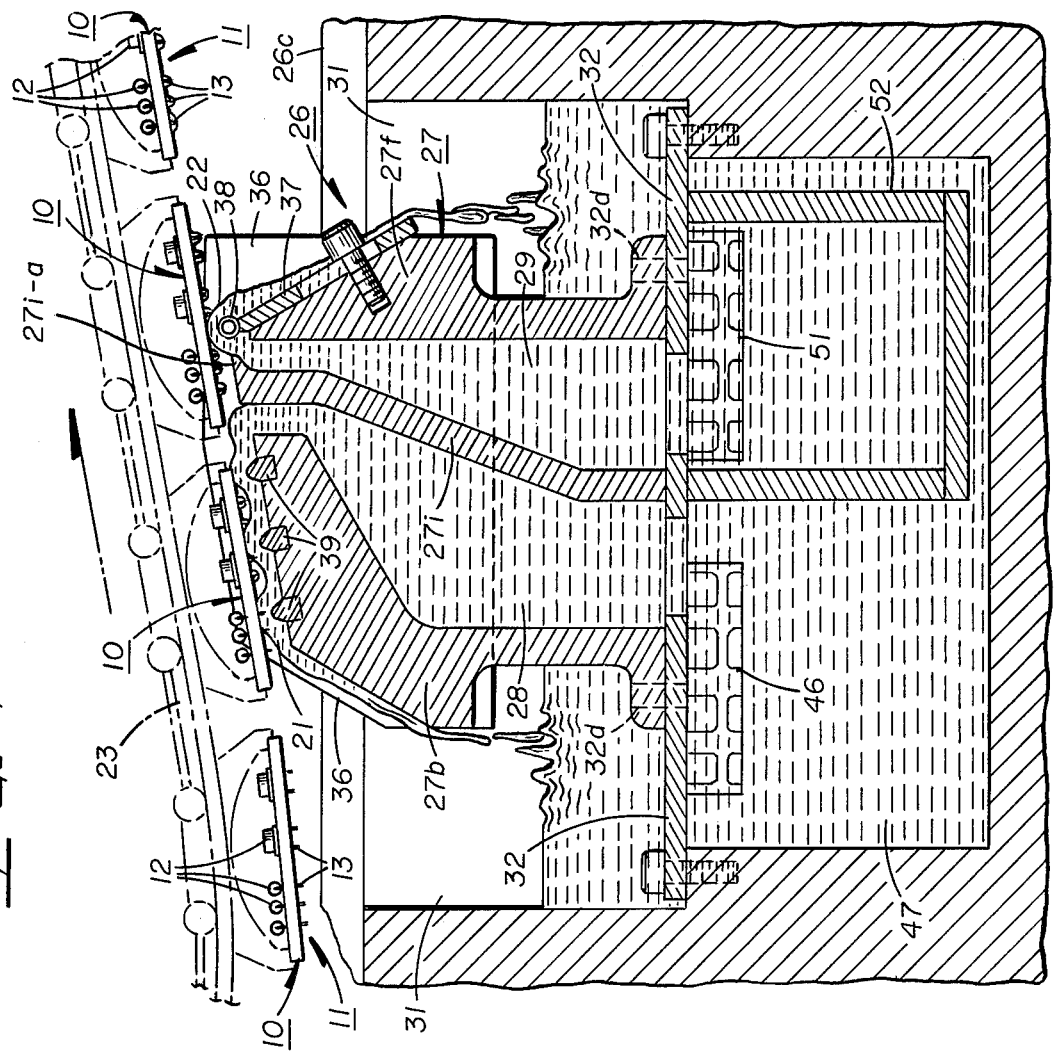
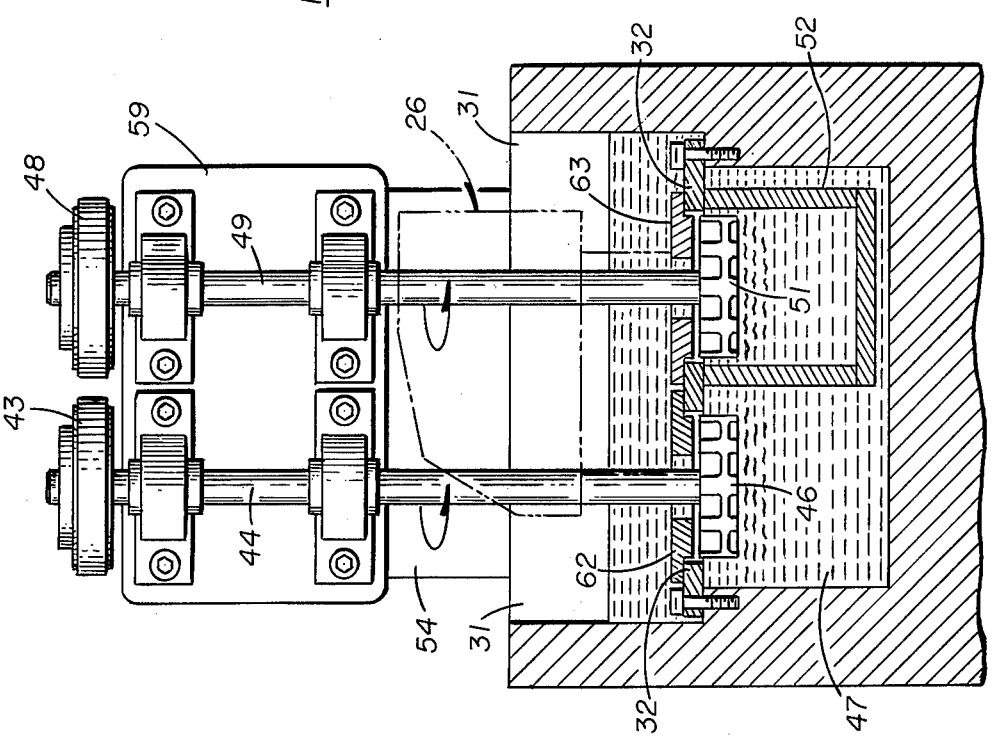

SOLDERING METHOD AND APPARATUS UTILIZING DUAL SOLDER WAVES OF DIFFERENT VARIABLE VELOCITIES

BACKGROUND OF THE INVENTION

1. Field of the Invention

This invention relates to a soldering method and apparatus utilizing dual solder waves of different variable velocities, and more specifically to a method and apparatus in which solder is fed to dual solder waves at different variable velocities to achieve proper soldering of terminals and associated conductor paths while reducing crossovers or bridges (i.e., shorts) between the terminals and the conductor paths.

2. Description of the Prior Art

The advent of miniaturized electrical devices, such as those employing integrated circuits, requires that terminals and conductor paths of printed circuit boards on which the devices are to be mounted be in extremely close relationship in order to accommodate the closely spaced leads of the electrical devices. As a result, the number of solder defects in the form of solder crossovers or bridges (i.e., shorts) between adjacent printed circuit board terminals and conductor paths when the leads of the electrical devices are soldered to the terminals of the printed circuit board in a wave soldering operation, has significantly increased.

Unless these solder crossovers are detected and removed prior to testing of a printed circuit board assembly, the assembly will test as being unsatisfactory. Further, in certain instances the solder crossovers may cause overloading and damage to sensitive electrical components. Accordingly, after the wave soldering operation each printed circuit board assembly must be subjected to close visual scrutiny in one or more inspection processes in order to detect any solder crossovers which have occurred, and the detected solder crossovers must be repaired manually prior to testing. In the event that a solder crossover is not detected and repaired, resulting in damage to one or more electrical components, the components must be removed from the printed circuit board and replaced with new components in a desoldering-resoldering process.

The occurrence of solder crossover defects is particularly prevalent in one-way solder waves in which the solder flows only in a direction counter to the direction of printed circuit board movement, and in this type of solder wave is attributed to a number of factors. For example, it has been found that in this type of solder wave a printed circuit board entering the solder wave restricts the counterflow of the solder surface, while allowing the solder to flow underneath the surface, thereby leaving the surface of the solder at the critical point of board exit essentially stationary or "stagnant" during the soldering operation. As a result, the inherent high surface tension of the solder inhibits the ability of the solder to separate properly as it coalesces on the printed circuit board terminals and conductor paths. At the same time, the formation of solder alloy oxides on the "stagnant" solder surface increases and the oxides inhibit the ability of the solder to wet properly to the terminals and conductor paths. The printed circuit board also exits from the solder, which is flowing counter to the direction of board movement beneath the solder surface, at a high velocity, tending to produce excessive "dragout" of solder from the solder wave. Accordingly, the net result of the high surface tension, oxide formation and high board exit velocity is a high incidence of solder crossovers.

The use of a bi-directional solder wave, in which the solder flows both counter to the direction of printed circuit board movement and in the direction of board movement, alleviates the formation of solder crossovers to a certain extent. In this connection, the development of a stationary or "stagnant" surface condition in the solder wave at the point of board exit, as in one-directional solder waves as above described, is eliminated since the solder is continuously moving in the same direction as the printed circuit board. As a result, the surface tension of the solder and its effect from the standpoint of forming solder crossovers, tend to be reduced. Further, any oxides, to the extent that they do form, are being continuously removed from contact with the printed circuit board by the flowing solder. However, a large number of solder crossovers still are formed during the wave soldering process, apparently as a result of a high degree of motion or turbulence in the solder as a printed circuit board passes through and exits from the bi-directional wave. Accordingly, the purpose of this invention is to provide a system wherein the flow of solder counter to the direction of printed circuit board movement and in the direction of printed circuit board movement can be varied independently as may be necessary to control the solder flow in order to reduce the incidence of solder crossovers in a wave soldering operation.

An example of a known bi-directional soldering apparatus is disclosed in the S. L. Rieben U.S. Pat. No. 3,119,363, in which surfaces of the apparatus which form opposite flowing parts of the bi-directional solder wave are adjustable for varying the length, angle of entry and angle of exit of the wave. Solder is fed to the bi-directional wave from a single source and the only control of the flow of the solder counter to, and in the direction of, printed circuit board movement is that produced inherently in the adjusting of the wave forming surfaces.

The J. A. Raciti U.S. Pat. No. 3,482,755 discloses a bi-directional wave soldering machine which is intended to eliminate solder bridges or crossovers and icicles by passing an article through a moving turbulent crest portion of the solder wave, and then moving the article through a calm solder pool which is contiguous to but lower than the moving wave crest. The H. P. Eschenbrucher U.S. Pat. No. 3,565,319 is directed to a bi-directional wave soldering apparatus in which solder is fed to a pair of twin solder waves without turbulence by the use of an inner pressure tank and then passed through ducts having inner perforated baffles or plates for producing solder in the two solder waves. As in the Rieben et al. patent, in each of the Raciti and Eschenbrucher patents the solder is fed to the soldering area from a single source.

SUMMARY OF THE INVENTION

In general, this invention relates to the wave soldering of an electrical device wherein the electrical device is moved along a predetermined path so that it engages a first solder wave flowing counter to the direction of movement of the device and a second solder wave flowing in the direction of movement of the device, in succession. Solder is fed to the first and second solder waves at different variable velocities independently of one another such that the formation of solder crossovers on the device is essentially eliminated.

More specifically, solder is pumped to the first solder wave from a first essentially enclosed sump upward through a first flow chamber to the first solder wave. Similarly, solder is pumped from a second essentially enclosed sump upward through a second flow chamber to the second solder wave. The sumps are isolated from one another, and the flow chambers also are isolated from one another, so that when optimum flow of solder in the two waves has been established, the pumping of the solder to the two waves can be accomplished independently without the flow of solder to one of the waves having any significant effect upon the other wave.

BRIEF DESCRIPTION OF THE DRAWINGS

FIG. 1 is an isometric view of a wave soldering apparatus in accordance with this invention.

FIG. 2 is an enlarged cross-sectional view taken along the line 2—2 of FIG. 1.

FIG. 3 is a cross-sectional view taken along the line 3—3 of FIG. 2.

FIG. 4 is a further enlarged cross-sectional view taken along the line 4—4 of FIG. 2.

FIG. 5 is a partial plan view of a printed circuit side of a printed circuit board device which may be processed with this invention.

DETAILED DESCRIPTION

Referring to FIGS. 4 and 5, an electrical device 10 which may be processed in accordance with this invention includes a printed circuit board 11 and a plurality of electrical components 12 (shown only in FIG. 4) having leads 13 extending through apertures in the board from one side thereof. On the opposite side of the printed circuit board 11 projecting portions of the component leads 13 are soldered to terminal pads 14 (shown only in FIG. 5) of a printed circuit 16 on the board, as for example, by passing the board over molten solder in a wave soldering operation. The projecting portions of certain of the leads 13 are bent over in a known manner (not shown) to retain the electrical components 12 on the printed circuit board 11 prior to and during the wave soldering operation.

With further reference to FIG. 5, as the molten solder wets the terminal pads 14 and the projecting portions of the leads 13, and then coalesces, soldered connections are formed between the component leads and the terminal pads. At the same time, the solder forms a protective conductive solder layer on conductor paths 17 of the printed circuit 16, except for gold plated fingers 17f of the printed circuit, which are suitably masked during the wave soldering process. In prior known wave soldering systems, however, particularly where the terminal pads 14 or conductor paths 17 of the printed circuit 16 are relatively close to one another, solder tends to bridge across between the terminal pads or the conductor paths to produce defects in the form of crossovers or electrical shorts 18 in the printed circuit. Accordingly, the subject method and apparatus is intended to eliminate these crossover defects 18 during a wave soldering operation.

With further reference to FIG. 4, the subject apparatus includes first and second solder waves 21 and 22 through which the printed circuit boards 11 are advanced in succession by a suitable conveyor 23. The first solder wave 21 flows counter to the direction of movement of the printed circuit boards 11 as they are moved along a predetermined path by the conveyor 23 and the second solder wave 22 flows in the direction of movement of the printed circuit boards along the predetermined path. The printed circuit boards 11 are advanced by the conveyor 23 so that the boards initially enter solder in the first wave 21 and subsequently exit from solder in the second wave 22. In this regard, the velocity of the flow of solder in the first and second solder waves 21 and 22 is independently variable to achieve flow conditions which achieve proper soldering of the component leads or terminals 13 to the terminal pads 14 (FIG. 5), and proper soldering of the conductor paths 17 (FIG. 5), while reducing the incidence of the solder crossover defects 18 (FIG. 5) on the printed circuit boards 11.

For this purpose, referring to FIGS. 1, 2 and 4, the subject apparatus comprises a bi-directional solder wave-forming assembly 26 which includes a one piece casting 27 of a suitable metal, such as cast iron. The metal casting 27 includes a front wall 27f, a back wall 27b (FIG. 4), an intermediate wall 27i (FIG. 4) and opposite side walls 27s (FIGS. 1 and 2) which define separate first and second solder flow chambers 28 and 29 (FIG. 4) for forming the first and second solder waves 21 and 22 (FIG. 4), respectively. The metal casting 27 is mounted in a main solder reservoir 31 on a horizontal mounting platform 32 (FIGS. 2, 3 and 4) disposed between the top and bottom of the reservoir and secured around its periphery to an inner peripheral ledge of the reservoir by suitable screws. The mounting platform 32 includes openings (FIG. 4) therethrough in alignment with lower openings in the flow chambers 28 and 29 of the metal casting 27 to permit solder flow upward through the platform and into the chambers.

As is best shown in FIGS. 1 and 2, the solder wave-forming assembly 26 also includes a pair of solder guide plates 36 secured by suitable screws to opposite sides of the metal casting 27 and projecting upward relative to the casting to define a solder-confining channel. In addition, a vertically adjustable baffle plate 37 (FIGS. 1, 2 and 4) is mounted on an inclined surface of the front wall 27f of the metal casting 27 and has a circular baffle rod 38 fixed (e.g., welded) to its upper end. The solder wave-forming assembly 26 is removably located on the platform 32 by suitable upwardly projecting dowels 32d (FIG. 4) fixedly mounted in the platform and receivable in apertures in the bottom of the casting 27. The solder wave-forming assembly 26 is secured to the main reservoir 31 by bars 26c connected with the solder guide plates 36 to the metal casting 27, and connected to top edges of the front and back walls of the main reservoir by screws 31c. Thus, the solder wave-forming assembly 26 readily can be removed from the main reservoir 31 for maintenance and can be replaced in the reservoir without having to drain the reservoir of solder.

As is best shown in FIG. 4, the first solder wave 21 is of a cascade-type in which the printed circuit sides of the printed circuit boards 11 to be soldered engage a series of solder crests in succession in a known manner. The solder crests are formed by elongated parallel ribs 39 (FIGS. 1 and 4) extending transversely to the direction of solder flow in the first solder wave 21 and fixedly mounted in corresponding slots in the metal casting 27. Solder from the first solder wave 21 flows back into the main reservoir 31 for reuse.

With further reference to FIG. 4, the second solder wave 22 is of a fountain-type in which solder flows upward out of the second flow chamber 29 in the metal casting 27 through an orifice defined by an arcuate lip portion 27i-a on the intermediate casting wall 27i and by the baffle rod 38 on the upper end of the adjustable baffle plate 37. The height of the second solder wave 22 can be adjusted by varying the velocity of flow of the solder and/or by changing the height of the baffle rod 38 to narrow or widen the orifice between the lip portion 27i-a and the rod. Solder from the second solder wave 22 flows over the baffle rod 38 and the baffle plate 37 and then back into the main reservoir 31 for reuse.

The solder flow in the first solder wave 21 is controlled by a first variable speed motor 41 (FIG. 1) and the solder flow in the second solder wave 22 is controlled by a second variable speed motor 42 (FIGS. 1 and 2). The first motor 41, through a first timing belt-and-pulley drive 43 and an associated drive shaft 44, drives a first pump impeller 46 (FIGS. 3 and 4) in a lower enclosed sump portion 47 of the main reservoir 31 located below the first solder wave flow chamber 28. Similarly, the second motor 42, through a second timing belt-and-pulley drive 48 and an associated drive shaft 49, drives a second pump impeller 51 (FIGS. 2, 3 and 4) in a separate enclosed sump 52 located beneath the second solder wave flow chamber 29. The motors 41 and 42 are mounted in side-by-side relationship on opposite sides of a vertical mounting plate 53 (FIGS. 1 and 2). An inner edge of the motor mounting plate 53 is secured (e.g., welded) to a vertical main mounting plate 54 secured at its lower end to a base plate 56. The speed of the motors 41 and 42 is controlled in a normal manner by respective control knobs 57 which may be located in a terminal cabinet 58 mounted beneath the second motor 42 on the motor mounting plate 53, or on a control panel (not shown) remote from the apparatus, as desired.

As is best shown in FIG. 3, the first pump impeller 46 is disposed in the lower sump portion 47 of the main reservoir 31 in alignment with an opening in the support platform 32 which permits insertion of the impeller into the sump portion and the removal of the impeller from the sump portion through the opening. Similarly, the second pump impeller 51 is disposed in the separate sump 52 in alignment with an identical associated opening in the mounting platform 32. Each of the impellers 46 and 51 is secured to the lower end of its respective one of the pair of vertical drive shafts 44 and 49 for rotation therewith. The shafts 44 and 49 are journaled in suitable bearings mounted on a vertical secondary mounting plate 59 and the upper ends of the drive shafts are drivingly connected to pulleys of their respective timing belt-and-pulley drives 43 and 48. The secondary mounting plate 59 is secured (e.g., welded) to a pair of parallel plates 61 (FIG. 1) secured to the vertical main mounting plate 54.

With further reference to FIG. 3, impeller cover plates 62 and 63 are secured to the mounting platform 32 above respective ones of the pump impellers 46 and 51 in encircling relationship to the impeller drive shafts 44 and 49. Each of the cover plates 62 and 63 includes a central aperture through which its associated drive shaft 44 or 49 extends and which is of a greater diameter than the diameter of the shaft so as to permit the flow of solder into the sump portion 47 of the main reservoir 31 or the separate enclosed sump 52, respectively, as the impellers 46 and 51 are driven by the motors 41 and 42 (FIG. 1).

Referring to FIGS. 2, 3 and 4, the separate enclosed sump 52 is of a rectangular box-like construction and includes vertical side walls, vertical end walls and a bottom plate secured together in a suitable manner, such as by welding. The thus formed sump 52 is secured to the bottom of the mounting platform 32 by suitable screws, not shown.

The mounting platform 32, the sump 52 and the second pump impeller cover plate 63 (FIGS. 2 and 3) form an enclosed chamber except for the solder entrance opening in the cover plate and the solder exit opening (FIGS. 2 and 4) in the mounting platform into the second flow chamber 29 for the second solder wave 22. Similarly, the mounting platform 32, the first impeller cover plate 62 (FIG. 3) and the wall portions of the main reservoir 31 forming the lower sump portion 47, with the exception of the solder entrance opening in the cover plate and the solder exit opening (FIG. 4) in the mounting platform into the first flow chamber 28 for the first solder wave 21, form an enclosed chamber.

Thus, once optimum solder flow in the first and second solder waves 21 and 22 has been established in operation of the apparatus, the rotation of the pump impellers 46 and 51 to pump solder to the waves can be accomplished without the rotation of either impeller having any significant effect on the solder flow being produced by the other impeller. More specifically, rotation of the first impeller 46 to draw solder from the upper portion of the main reservoir 31 through the opening in the impeller cover plate 62 into the sump portion 47 of the main reservoir, and to pump solder in the sump portion upward through the flow chamber 28 to the first solder wave 21, has no significant effect upon the solder being drawn into the separate enclosed sump 52 by the second impeller 51 through the opening in the impeller cover plate 63, and being pumped by the latter impeller from the sump upward through the second flow chamber 29 to the second solder wave 22. Similarly, the solder flow produced by the second impeller 51 has no significant effect on the solder flow produced by the first impeller 46.

In reducing the incidence of the solder crossovers 18 (FIG. 5), the exact rate of flow of the solder in the solder waves 21 and 22 in any particular instance is determined by trial-and-error, with the rate of flow for each wave set so as to achieve proper soldering of the electrical devices 10 (e.g., the leads 13, terminal pads 14 and conductor paths 17), while reducing the presence of the solder crossovers to a minimum. By way of illustration, however, favorable results have been attained when the height and velocity of flow of solder in the first solder wave 21 (counter to the direction of printed circuit board movement) was set at a velocity which provides substantial engagement of the solder with the printed circuit boards 11, as is illustrated in FIG. 4 by the flat interengagement of the crests of the first solder wave and one of the boards. In contrast, the height and velocity of flow of solder in the second solder wave (in the direction of printed circuit board movement), utilizing both speed control of the motor 42 and height adjustment of the baffle rod 38, was set such that the printed circuit boards 11 engaged the upper surface of the wave in essentially tangential relationship as illustrated in FIG. 4. When the flow rates in the solder waves 21 and 22 were established in this manner, a reduction in a solder crossover defect rate from on the order of 2-3%, to on the order of 0.3-0.4%, has been achieved.

While the exact reasons for these improved results are not completely understood, they are attributed, at least in part, to engagement of the printed circuit boards 11 in the final phase of the soldering operation with solder (i.e., the solder wave 22) which is flowing constantly in the same direction as the boards are moving, whereby the effects of surface tension and oxide formation on the surface of the solder in the final phase of the soldering operation are minimized. At the same time, the solder is flowing under accurately controlled conditions in the same direction as the printed circuit boards 11, whereby a smooth disengagement of the boards from the solder wave 22, without undue motion or turbulence, can be achieved. Further, to the extent that solder crossovers 18 (FIG. 5) may be formed on the printed circuit boards 11 as they pass through the first solder wave 21, they apparently are essentially eliminated as the boards subsequently pass through the second solder wave 22.

With the solder waves 21 and 22 established as above described and as shown in FIG. 4, it was found that the flow rate in the first solder wave 21 exceeded the flow rate in the second solder wave 22. In other situations, however, depending on the type of electrical device being soldered and the solder wave velocity settings required to produce satisfactory results, it is contemplated that this velocity differential may be reversed. Further, while in FIG. 4 the solder waves 21 and 22 are shown in spaced relationship as they exit from their respective flow chambers 28 and 29, the lip portion 27i-a of the casting intermediate wall 27i can be made removable with the upper end of the intermediate wall shaped so that opposing surfaces of the solder waves essentially engage as they exit from the flow chambers, but with the waves still flowing in opposite directions, if so desired.

In summary, a new and improved soldering method and apparatus has been provided in which the velocity of the solder flow in the first and second solder waves 21 and 22 (FIG. 4) can be independently controlled to reduce the number of crossover defects 18 (FIG. 5) on the printed circuit boards 11. In this connection, as is illustrated in FIG. 4 by way of example, the solder flow in the first solder wave 21 counter to the direction of printed circuit board movement can be set at a rate which produces substantial contact of the crests of the wave with the printed circuit boards 11, and the solder flow in the second solder wave 22 in the direction of printed circuit board movement can be set at a rate which provides tangential engagement of the printed circuit boards with the solder and a smooth disengagement of the printed circuit boards from the solder. The control of the solder velocity in the first and second solder waves 21 and 22 readily can be achieved by adjusting the speeds of the drive motors 41 and 42 (FIG. 1), which cause pumping of solder from the enclosed sump portion 47 (FIGS. 3 and 4) of the main reservoir 31 and the separate enclosed sump 52 (FIGS. 2, 3 and 4) within the main reservoir, through rotation of the pump impellers 46 and 51. Since the solder in the main reservoir sump portion 47 is isolated from the solder in the separate sump 52, and since the solder in the first flow chamber 28 (FIG. 4) is isolated from the solder in the second flow chamber 29 by the intermediate wall 27i of the metal casting 27, once the optimum flow rates in the two solder waves have been established the pumping of solder to the first and second solder waves 21 and 22 can be accomplished independently without the flow to either solder wave significantly affecting the other solder wave. Further, as the rate of flow of solder in the second solder wave 22 is varied, the baffle plate 37 and the baffle rod 38 mounted thereon can be vertically adjusted to narrow or widen the orifice between the baffle rod and the lip portion 27i-a (FIG. 4) of the intermediate casting wall 27i to provide an accurate control over the height of the second solder wave, as may be required.

What is claimed is:

1. A method of soldering an electrical device which is movable along a predetermined path, which comprises:
   producing a first solder wave which flows counter to the direction of movement of the electrical device along the predetermined path;
   producing a second solder wave which flows in the direction of movement of the electrical device along the predetermined path;
   moving the electrical device along the predetermined path so that the electrical device engages the first and second solder waves in succession; and
   feeding solder to said first and second solder waves at different variable velocities indpendently of one another.

2. A method as recited in claim 1, in which:
   solder is fed to the first solder wave at a higher velocity than the velocity at which solder is fed to the second solder wave, and the solder is fed to the second solder wave at a speed correlated to the speed of the electrical device along the predetermined path whereby the electrical device exits from the second solder wave without undue turbulence.

3. A method as recited in claim 1, in which the feeding of solder to the solder waves involves the steps of:
   isolating the solder to be fed to the first solder wave from the solder to be fed to the second solder wave so that solder flow to one of the solder waves has no significant effect upon solder flow to the other solder wave; and
   independently pumping solder to the first and second solder waves at different variable velocities.

4. Apparatus for soldering an electrical device which comprises:
   means for moving the electrical device along a predetermined path;
   means for producing a first solder wave which flows counter to the direction of movement of the electrical device along the predetermined path;
   means for producing a second solder wave which flows in the direction of movement of the electrical device along the predetermined path, said moving means moving the electrical device along the predetermined path so that the electrical device engages the first and second solder waves in succession; and
   means for feeding solder to said first and second solder waves at different variable velocities independently of one another.

5. Apparatus for soldering an electrical device as recited in claim 4, in which:
   said means for producing the first solder wave includes a cascade-type device for producing a series of solder crests successively engageable by the electrical device as the electrical device is moved along the predetermined path; and
   said means for producing the second solder wave includes a vertically adjustable baffle.

6. Apparatus for soldering an electrical device as recited in claim 4, in which:

said solder feeding means includes first and second independent pump means for pumping the solder to the first and second solder waves, respectively.

7. Apparatus for soldering an electrical device as recited in claim 6, which further comprises:

first and second separate sumps for providing solder to the first and second solder waves, respectively, said first and second pump means being disposed in respective ones of said sumps and said sumps being isolated from one another such that, when optimum flow rates in the solder waves have been established, solder flowing from one sump to its respective solder wave is isolated from and has no significant effect upon solder flowing from the other sump to its respective solder wave.

8. Apparatus for soldering an electrical device as recited in claim 7, in which:

said means for producing the first and second solder waves defines separate flow chambers for conducting solder from said first and second sumps to the first and second solder waves, respectively, the flow chambers being isolated from one another such that solder flowing in one flow chamber has no effect upon solder flowing in the other flow chamber.

9. Apparatus for soldering an electrical device as recited in claim 8, in which:

said first and second sumps are located directly beneath the first and second flow chambers, respectively.

10. Apparatus for soldering an electrical device as recited in claim 9, which further comprises:

a solder reservoir in which both of said first and second sumps are located, said sumps having respective openings therein through which solder flows from said reservoir into said sumps.

* * * * *